United States Patent
Nakai et al.

(10) Patent No.: US 8,054,679 B2
(45) Date of Patent: Nov. 8, 2011

(54) PHASE CHANGE MEMORY DEVICE

(75) Inventors: Kiyoshi Nakai, Tokyo (JP); Shuichi Tsukada, Tokyo (JP); Yusuke Jono, Tokyo (JP)

(73) Assignee: Elpida Memory Inc., Tokyo (JP)

( * ) Notice: Subject to any disclaimer, the term of this patent is extended or adjusted under 35 U.S.C. 154(b) by 814 days.

(21) Appl. No.: 12/213,195

(22) Filed: Jun. 16, 2008

(65) Prior Publication Data
US 2008/0316806 A1    Dec. 25, 2008

(30) Foreign Application Priority Data
Jun. 19, 2007 (JP) ................. 2007-161936

(51) Int. Cl.
G11C 11/00 (2006.01)
(52) U.S. Cl. ..................... 365/163; 365/148
(58) Field of Classification Search .......... 365/46, 365/94, 100, 113, 129, 148, 163; 257/2–5, 257/9, 296, 310, E21.35, E31.047, E27.006; 438/29, 95, 96, 166, 135, 240, 785, 259, 438/365, 482, 486, 597; 977/754
See application file for complete search history.

(56) References Cited

U.S. PATENT DOCUMENTS

| | | | |
|---|---|---|---|
| 7,365,355 B2* | 4/2008 | Parkinson | 257/3 |
| 7,646,630 B2* | 1/2010 | Lowrey et al. | 365/163 |
| 7,706,178 B2* | 4/2010 | Parkinson | 365/163 |
| 2005/0270883 A1 | 12/2005 | Cho et al. | |
| 2006/0097240 A1* | 5/2006 | Lowrey et al. | 257/5 |
| 2006/0097343 A1* | 5/2006 | Parkinson | 257/528 |
| 2008/0211539 A1* | 9/2008 | Parkinson | 326/41 |

* cited by examiner

Primary Examiner — Richard Elms
Assistant Examiner — Harry W Byrne
(74) Attorney, Agent, or Firm — McGinn IP Law Group, PLLC

(57) ABSTRACT

A phase change memory device comprises: a phase change element for rewritably storing data by changing a resistance state; a memory cell arranged at an intersection of a word line and a bit line and formed of the phase change element and a diode connected in series; a select transistor formed in a diffusion layer below the memory cell, for selectively controlling electric connection between an anode of the diode and a ground line in response to a potential of the word line connected to a gate; and a precharge circuit for precharging the diffusion layer below the memory cell corresponding to a non-selected word line to a predetermined voltage and for disconnecting the diffusion layer below the memory cell corresponding to a selected word line from the predetermined voltage.

14 Claims, 8 Drawing Sheets

PHASE CHANGE MEMORY DEVICE

BACKGROUND OF THE INVENTION

1. Field of the Invention

The present invention relates to a non-volatile phase change memory device for rewritably storing data using a change in resistance state of a phase change element, and particularly relates to a phase change memory device in which a memory cell is formed by connecting the phase change element and a diode in series.

2. Description of the Related Art

A non-volatile semiconductor memory device such as a flash memory becomes more important in recent years. Particularly, attention is paid to a phase change memory device as a promising technique, which uses structural change of phase change material. The phase change memory device has a structure in which a resistance state of a phase change element made of the phase change material is changed by heat and thereby data can be rewritably stored. In a write operation of the phase change memory device, joule heat due to current is generated so as to change the resistance state of the phase change element, and thus relatively large write current such as 500 µA to 1 mA is required. Therefore, if a MOS transistor is used as a select switch of the phase change element in a case of configuring a memory cell of the phase change memory device, it needs to have a gate width large enough to flow the write current and a reduction in cell size becomes difficult. On the other hand, a configuration advantageous for reducing the cell size is proposed, in which a diode is used as an select switch for the phase change element (For example, see US 2005/0270883).

FIG. 7 shows a basic configuration of the conventional phase change memory device having memory cells using diodes. In FIG. 7, each of memory cells MC is formed of a phase change element 10 and a diode 11 which are connected in series. The memory cells MC are arranged at intersections of word lines WL and bit lines BL in a matrix form, one ends of phase change elements 10 are connected to the bit lines BL and anodes of diodes 11 are connected to the word lines WL. Since large current can be flown through the diode 11 with a small area, the cell size of each memory cell MC can be reduced so as to reduce an entire area of the phase change memory device.

In the write operation of the phase change memory device shown in FIG. 7, a specified memory cell MC is selected and write current flows along a path P0 from the bit line BL to the word line WL through the memory cell MC. At this point, an operation of writing multi-bit data on the same word line WL at the same time is assumed as well as the write operation of one bit data. In this case, write current for a selected plurality of memory cells MC flows into one word line WL at the same time along a plurality of current paths P0. Since the resistance component of the word line WL is relatively large, the potential of the word line WL rises when large write current flows intensively. As a result, the write current reduces. Further, when reading out the other memory cell MC during the write operation for the specified memory cell MC on the word line WL, an increase in the potential of the word line WL causes noise and high-speed read operation is hindered.

Mean while, a configuration shown in FIG. 8 may be employed in order to avoid current concentration on the word line WL in FIG. 7. In the configuration of FIG. 8, a select transistor 12 is disposed below the same memory cell MC as in FIG. 7. In the select transistor 12, its gate is connected to the word line WL, one end of a diffusion layer D is connected to the anode of each diode 11, and the other end of the diffusion layer D is connected to a ground line GL arranged in parallel with the bit line BL. Thus, a current path P1 for the write operation of the phase change memory device shown in FIG. 8 is formed through the bit line BL, the memory cell MC, the one end of the diffusion layer D of the select transistor 12 and the other end thereof, and reaches the ground line GL. By such a configuration, even when writing the multi-bit data on the same word line WL at the same time, the current concentration on the word line WL is avoided.

However, if the configuration of FIG. 8 is employed, the select transistor 12 connected to a non-selected word line WL remaining at a low level turns off, and thus the diffusion layer D below the non-selected memory cell MC connected to the select transistor 12 becomes a floating state. When reading out the other selected memory cell MC through the same bit line BL as for the above non-selected memory cell MC in such a state, the diffusion layer D in the floating state is charged. Then, the charge current continues to flow until a predetermined time depending on a diffusion layer capacitance elapsed, and in this time period, a state occurs in which the resistance state of the phase change element 10 can not be determined. The select transistor 12 is required to be formed with a large gate width capable of flowing a large write current. Therefore, the diffusion layer capacitance of the diffusion layer D becomes a large value, and the time required for the above charging is correspondingly becomes longer. Particularly, when the phase change element 10 is written to be in the high resistance state, the time required for charging the diffusion layer D becomes further longer so that read speed drastically decreases.

BRIEF SUMMARY OF THE INVENTION

It is an object of the present invention to provide a phase change memory device capable of suppressing influence of a diffusion layer capacitance below a non-selected memory cell and performing high-speed read operation, in which a large number of memory cells each formed of a phase change element and a diode are arranged with high density.

An aspect of the present invention is a phase change memory device comprising: a phase change element for rewritably storing data by changing a resistance state; a memory cell arranged at an intersection of a word line and a bit line and formed of the phase change element and a diode connected in series; a select transistor formed in a diffusion layer below the memory cell, for selectively controlling electric connection between an anode of the diode and a ground line in response to a potential of the word line connected to a gate; and a precharge circuit for precharging the diffusion layer below the memory cell corresponding to a non-selected word line to a predetermined voltage and for disconnecting the diffusion layer below the memory cell corresponding to a selected word line from the predetermined voltage.

According to the phase change memory device of the present invention, the memory cell formed of the phase change element and the diode is arranged at the intersection of the word line and the bit line, and there are provided the select transistor for selecting the memory cell according to the word line and the precharge circuit for precharging the diffusion layer below the memory cell. The precharge circuit allows the diffusion layer below the memory cell corresponding to the selected word line to be in a floating state, and operates to precharge the diffusion layer below the memory cell corresponding to the non-selected word line to the predetermined voltage. Thus, when the memory cell is not selected, the lower diffusion layer becomes a charged state and influence of a diffusion layer capacitance is reduced when subsequently reading the memory cell, so that a decrease in read speed can be effectively prevented. Further, it can be avoided that write current intensively flows through the word line, and memory cells can be arranged with high density by reducing the cell size, while obtaining sufficient write current.

In the semiconductor device, a write current may be controlled to flow along a path connecting the bit line, the phase change element, the diode, the select transistor and the ground line during write operation of the memory cell.

In the semiconductor device, the diffusion layer may be formed in a rectangular area including N (N is an integer greater than or equal to two) memory cells in a bit line direction and two memory cells in a word line direction, and two said select transistors commonly connected to at least the N memory cells in the bit line direction may be provided. In this case, the ground line may be arranged in a mesh form in the bit line direction and the word line direction.

In the semiconductor device, the word line may have a hierarchical word line structure with a main word line and sub-word lines, a sub-word driver for selectively activating one of a predetermined number of the sub-word lines when the main word line is selected may be provided, and each of the sub-word lines may be connected to a gate of the select transistor. In this case, the precharge circuit may be provided for each of the sub-word drivers, the precharge circuit corresponding to a non-selected sub-word line may be controlled to precharge the diffusion layer to the predetermined voltage, and the precharge circuit corresponding to a selected sub-word line may be controlled to disconnect the diffusion layer from the predetermined voltage.

Further, when the hierarchical word line structure is employed for the present invention, the precharge circuit may include a PMOS transistor having a gate to which the sub-word line is connected and for controlling connection of the diffusion layer with the predetermined voltage, and the sub-word line may be controlled to be a high level when selected and to be a low level when non-selected. Meanwhile, the precharge circuit may include an NMOS transistor having a gate to which an inverted main word line obtained by inverting the main word line is connected and for controlling connection of the diffusion layer with the predetermined voltage, and the main word line may be controlled to be a high level when selected and to be a low level when non-selected.

As described above, according to the present invention, the memory cell is formed of the phase change element and the diode, and the lower diffusion layer is precharged by the precharge circuit when the memory cell is not selected. Thereby, the diode becomes a reverse-biased state when seeing the memory cell from the bit line so that influence of the diffusion layer capacitance is suppressed. Accordingly, a decrease in reading speed can be prevented by the operation of charging the diffusion layer capacitance during read operation of the memory cell, so that high-speed read operation can be achieved. Further, sufficient write current flowing from the select transistor to the ground line is obtained, and the phase change memory device can be configured in which memory cells are arranged with high density by reducing the cell size.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which.

DETAILED DESCRIPTION OF THE INVENTION

An embodiment of the present invention will be described below with reference to accompanying drawings. In this embodiment, a case will be described where the present invention is applied to a phase change memory device employing a hierarchical word line structure and rewritably storing data using memory cells each formed of a phase change element and a diode.

Figure 1:
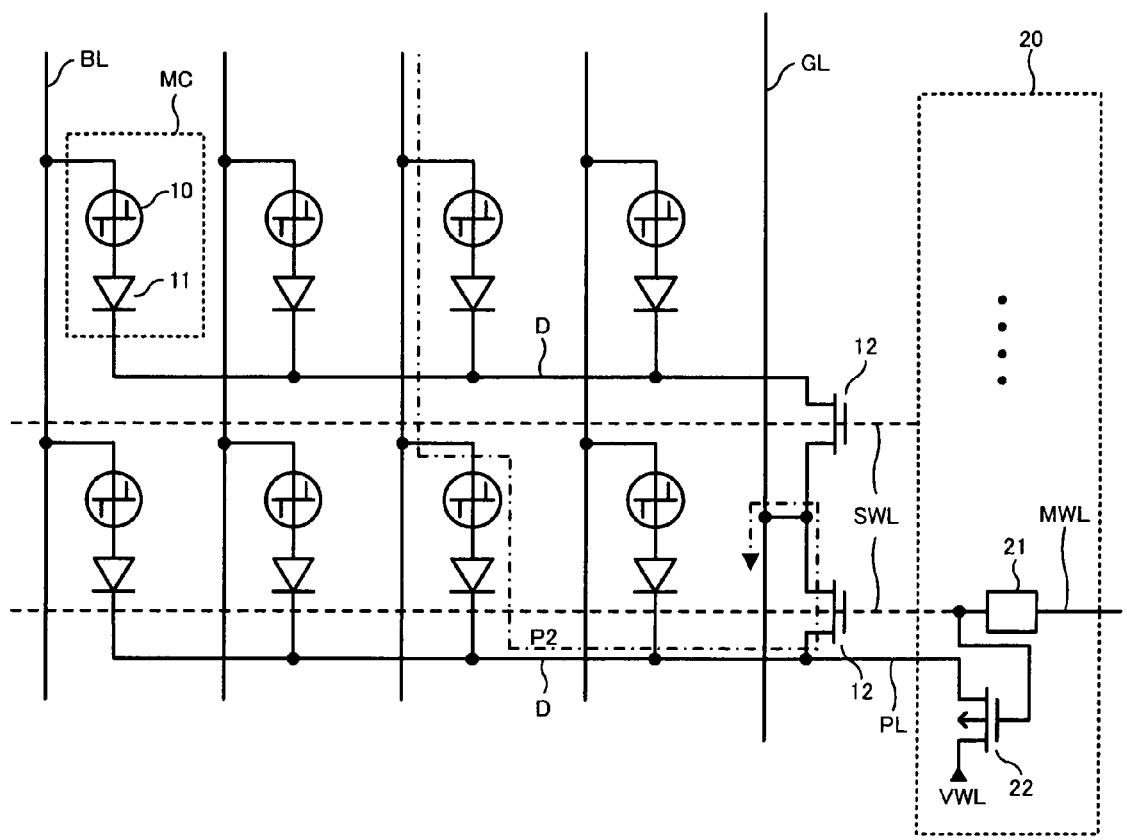
FIG. 1 is a diagram showing a basic circuit configuration of a phase change memory device of an embodiment of the present invention.

FIG. 1 is a diagram showing a basic circuit configuration of the phase change memory device to which the present invention is applied. In FIG. 1, a large number of memory cells MC are arranged in a matrix form at intersections of sub-word lines SWL and bit lines BL. Further, a select transistor 12 is disposed below the memory cell MC. In the select transistor 12, its gate is connected to the sub-word line SWL, one end of a diffusion layer D is connected to anodes of a plurality of diodes 11, and the other end of the diffusion layer D is connected to a ground line GL arranged in parallel with the bit line BL. Each memory cell MC is formed of a phase change element 10 and the diode 11 which are connected in series, one end of the phase change element 10 is connected to the bit line BL, and the anode of the diode 11 is connected to the diffusion layer D.

In a write operation of the phase change memory device of FIG. 1, write current flows along a path P2 in the order of the bit line BL, the phase change element 10, the diode 11, the select transistor 12 and the ground line GL. In this embodiment, influence of a diffusion layer capacitance of the select transistor 12 can be suppressed by operation of a precharging PMOS transistor 22 which functions as a precharge circuit of the present invention, which will be described in detail later.

Meanwhile, a sub-word circuit 20 is arranged adjacent to a memory cell area including a large number of memory cells MC. The sub-word circuit 20 is provided for achieving the hierarchical word line structure and includes sub-word drivers 21 and precharging PMOS transistors 22, both of which are arranged for each sub-word line SWL. The sub-word driver 21 is a circuit for selectively activating a predetermined number of sub-word lines SWL corresponding to a main word line MWL. A plurality of sub-word drivers 21, the number of which is the number of the sub-word lines SWL, are repeatedly arranged in the sub-word circuit 20, which is not shown in FIG. 1. A selected main word line MWL is controlled to be a high level, and a correspondingly selected sub-word line SWL is also controlled to be a high level.

The precharging PMOS transistor 22 has a source connected to a supply voltage VWL, a drain connected to a precharge line PL, and a gate connected to the sub-word line SWL. The precharge line PL is connected to one end of the diffusion layer D of the above select transistor 12 via a contact. When the sub-word line SWL is selected, the precharging PMOS transistor 22 becomes an OFF state so that the precharge line PL is disconnected from the supply voltage VWL. When the sub-word line SWL is not selected, the precharging PMOS transistor 22 becomes an ON state so that the precharge line PL becomes a high level. A plurality of precharging PMOS transistors 22, the number of which is the number of the sub-word lines SWL, are repeatedly arranged in the sub-word circuit 20 in the same manner as the sub-word drivers 21, which is not shown in FIG. 1. In addition, a specific configuration of the sub-word driver 21 will be described later.

Figure 2:
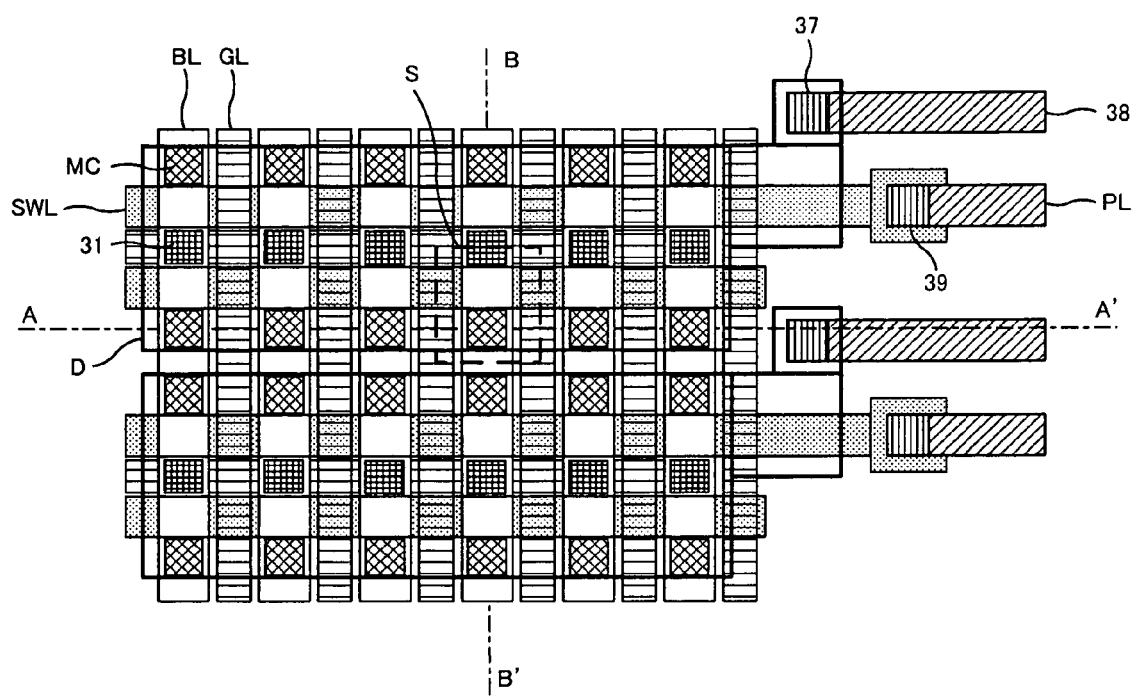
FIG. 2 is a diagram showing a layout corresponding to the circuit configuration of FIG. 1.
Figure 3A:
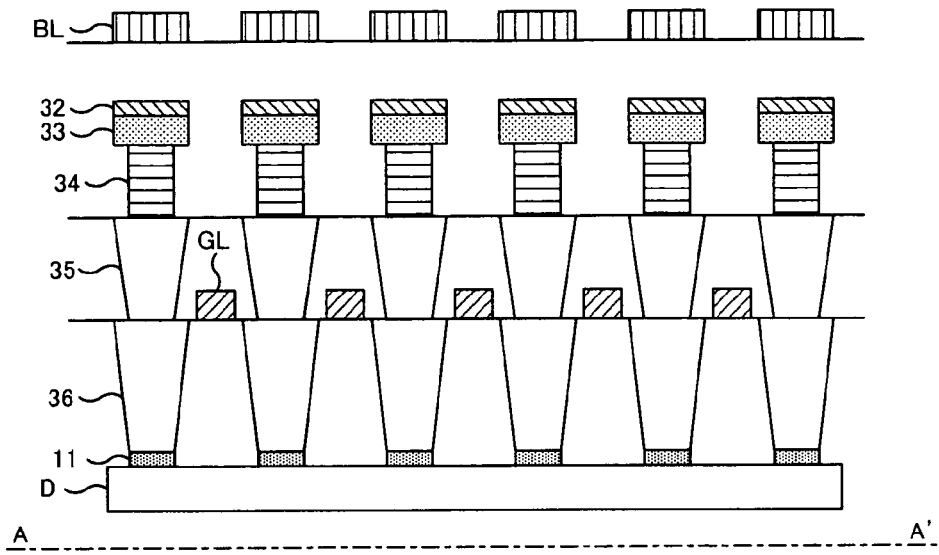
FIGS. 3A and 3B are schematic sectional diagrams of the layout of FIG. 2.
Figure 3B:
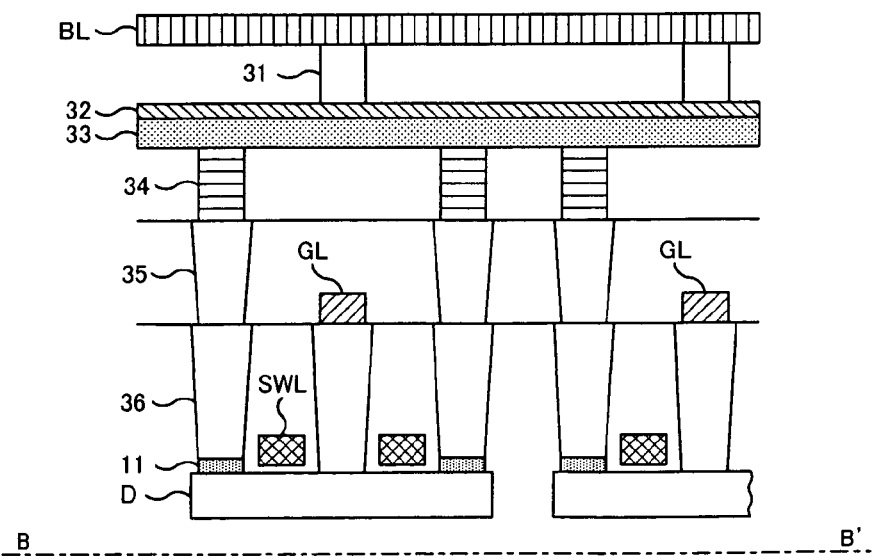

FIG. 2 shows a layout corresponding to the circuit configuration of FIG. 1. Further, FIGS. 3A and 3B show schematic sectional diagrams of the layout of FIG. 2. FIG. 3A shows a sectional structure at A-A' section in FIG. 2, and FIG. 3B shows a sectional structure at B-B' section in FIG. 2. As shown in FIG. 2, a plurality of sub-word lines SWL extend in a lateral direction to a plane of FIG. 2, a plurality of bit lines BL extend in a longitudinal direction in the plane of FIG. 2, and memory cells MC are arranged at intersections of the lines. Since each memory cell MC is formed with a vertical structure, it can be arranged with high density in a cell size S which is surrounded by a dotted line in FIG. 2. For example, a cell size S of 6F2 can be achieved relative to a design rule F for the layout.

As shown in FIG. 3B, the bit lines BL formed by low-resistance aluminum or the like are arranged at an uppermost portion. Each bit line BL is connected to an upper electrode 32 via a contact 31, and a phase change layer 33 is formed there below. The upper electrode 32 and the phase change layer 33 are arranged in parallel so as to overlap with the bit line BL. The phase change layer 33 can be formed, for example, Ge, Sb and Te as chalcogenide phase change material. A portion of the phase change layer 33, at which the memory cell MC is positioned, corresponds to the phase change element 10 of FIG. 1 and is connected to an upper end of a heater 34 right below the position. The heater 34 functions to heat the phase change element 10 when the write current flows and to reversibly change its sate between a high-resistance amorphous state and a low-resistance crystalline state. A lower end of the heater 34 is connected to an upper end (cathode) of the diode 11 via contacts 35 and 36.

A lower end (anode) of the diode 11 is connected to the diffusion layer D of the select transistor 12. Each diffusion layer D is formed in a rectangular area including N (N=six in FIG. 2) memory cells MC in a word line direction and two memory cells MC in a bit line direction. As shown in FIGS. 2 and 3A, the ground line GL extending in the bit line direction is formed of tungsten or the like below a position between adjacent bit lines BL. The ground line GL also extends in the word line direction as shown in FIG. 3B, and is connected to the diffusion layer D via the contact 36. In this manner, since the resistance of the ground line GL is relatively large, the resistance is reduced by arranging the ground line GL in a mesh form in a plane. Thus, when the write current concentrates on the ground line GL, it is possible to avoid that the potential of the ground line GL increases.

Further, the sub-word line SWL extends above a channel region of the diffusion layer D via a gate oxide film (not shown) at a position between adjacent contacts 36 in FIG. 3B. As shown in FIG. 2, one end of the sub-word line SWL is connected to a wiring 38 in an upper layer via a contact 37. This wiring 38 is connected to the output side of the sub-word driver 21. Further, one end of the diffusion layer D is connected to the precharge line PL in an upper layer via a contact 39. Note that the wiring 38 and the precharge line PL are formed at the same height as the ground line GL.

As shown in FIG. 3B, one diffusion layer D is connected to respective diodes 11 of two memory cells MC arranged at both ends in the bit line direction, and is connected to the ground line GL via the contact 36 at the center. Two select transistors 12 sharing one source/drain region are formed with a symmetrical arrangement in the bit line direction of the diffusion layer D, and two sub-word lines SWL are arranged above the respective channel regions. Thus, the write currents flowing in the respective memory cells MC combine through the diodes 11 and the diffusion layers D so as to flow into the ground line GL.

Figure 4:
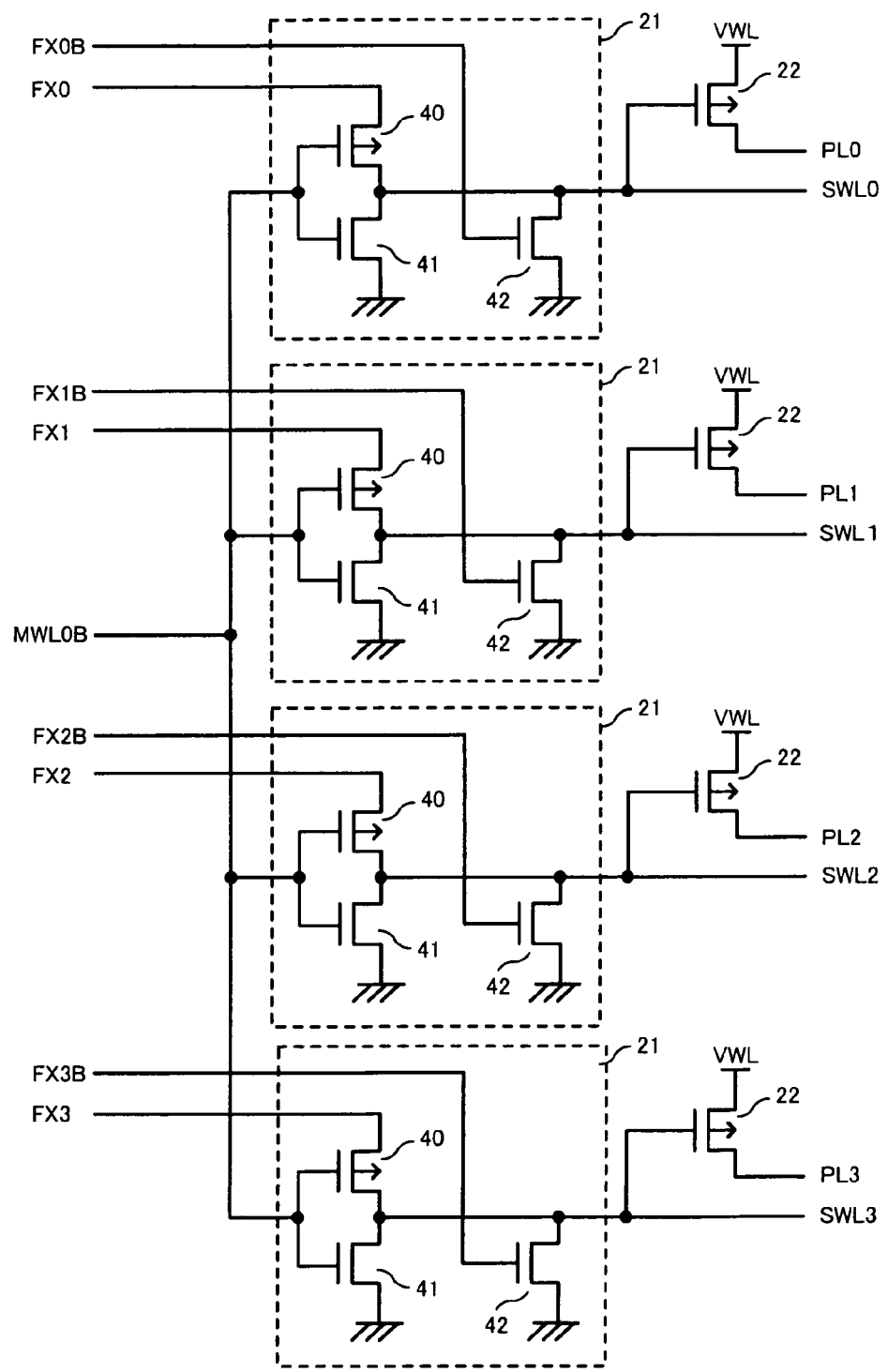
FIG. 4 is a diagram showing an example of a circuit configuration of the sub-word circuit 20 of the embodiment.

Next, FIG. 4 shows an example of a circuit configuration of the sub-word circuit 20. The sub-word circuit 20 shown in FIG. 4 includes four sub-word drivers 21 for selectively activating four sub-word lines SWL0, SWL1, SWL2, SWL3 corresponding to one main word line MWL0 (not shown in FIG. 4), and four precharging PMOS transistors 22 connected to four precharge lines PL0 to PL3. Each sub-word driver 21 includes a pair of a PMOS transistor 40 and an NMOS transistor 41 which form an inverter, and includes an NMOS transistor 42 on the output side.

In the respective sub-word drivers 21, an inverted main word line MWL0B obtained by inverting the main word line MWL0 is connected to input sides (gates) of the inverters, and sub-word lines SWL0 to SWL3 are connected to output sides (drains) of the inverters respectively. Sub-word select lines FX0, FX1, FX2 and FX3 are connected to sources of the PMOS transistors 40 respectively, and sources of the NMOS transistors 41 are connected to ground. When the main word line MWL0 is selected during normal operation and becomes a high level, the inverted main word line MWL0B becomes a low level.

At this point, one of the four sub-word select lines FX0 to FX3 is selected and becomes a high level, and corresponding one sub-word driver 21 is activated. Thus, one sub-word line SWL connected to the activated sub-word driver 21 selectively becomes a high level. When the sub-word line SWL becomes a high level, a corresponding precharging PMOS transistor 22 becomes an OFF state, and the precharge line PL on the output side is disconnected from the supply voltage VWL.

Meanwhile, non-selected three of the sub-word select lines FX0 to FX3 become a low level, and corresponding three sub-word drivers 21 remain in an inactivated state. As shown in FIG. 4, the NMOS transistor 42 of each sub-word driver 21 is connected between the sub-word line SWL and ground, and inverted sub-word select lines FX0B to FX3B obtained by inverting the sub-word select lines FX0 to FX3 are connected to gates of the NMOS transistors 42 respectively. The NMOS transistors 42 are provided for the purpose of avoiding a floating state of the non-selected sub-word lines SWL. That is, when the inverted sub-word select lines FX0B to FX3B corresponding to the non-selected sub-word select lines FX0 to FX3 become a high level, the NMOS transistor 42 connected thereto turns on and the sub-word line SWL on the output sides is compulsorily pulled down to a low level. At this point, corresponding precharging PMOS transistors 22 become an ON state, and the precharge lines PL on the output sides are connected to the supply voltage VWL.

For example, a state is assumed in which one sub-word line SWL0 selected by the sub-word select line FX0 is high and other three non-selected sub-word lines SWL1 to SWL3 are low. In this sate, one precharge line PL0 corresponding to the selected sub-word line SWL0 is in a floating state while three precharge lines PL1 to PL3 corresponding to the non-selected sub-word lines SWL1 to SWL3 become a high level. Thus, the diffusion layers D connected to the precharge lines PL1 to PL3 are precharged through the precharging PMOS transistors 22, and the potential of the diffusion layers D is pulled up to a high level after a predetermined time elapses. On the contrary, the diffusion layer D connected to the precharge line PL0 is not precharged and becomes a floating state.

During stand-by operation, since the inverted main word line MWL0B is controlled to be a high level and the four sub-word lines FX0 to FX3 are controlled to be a low level, all the four sub-word lines SWL0 to SWL3 become a low level. Thus, all the four precharging PMOS transistors 22 become an ON state, the respective precharge lines PL0 to PL3 are connected to the supply voltage VWL. Thereby, a state in which all the diffusion layers D are precharged to a high level is maintained during stand-by operation.

By the above-mentioned operation, when the memory cell MC is in a non-selected state, the lower diffusion layer D therebelow is in a state of being charged to a high level, and the lower diode 11 is in a reverse-biased state. Thereby, the connection is made so that the reversed-biased diode 11 is connected between the bit line BL to which the non-selected memory cell MC is connected and the diffusion layer D, thereby the diffusion layer capacitance of the diffusion layer D cannot be seen from the bit line BL. Regarding the selected memory cell MC, since the diffusion layer D is disconnected from the precharge line PL, the lower diode 11 is in a forward-biased state during the operation of the memory cell MC. When one memory cell MC is selected on the same bit line BL, all the diffusion layers D below other non-selected memory cells MC are in a charged state, and therefore it is possible to prevent a decrease in read speed due to the diffusion layer capacitance.

Figure 5:
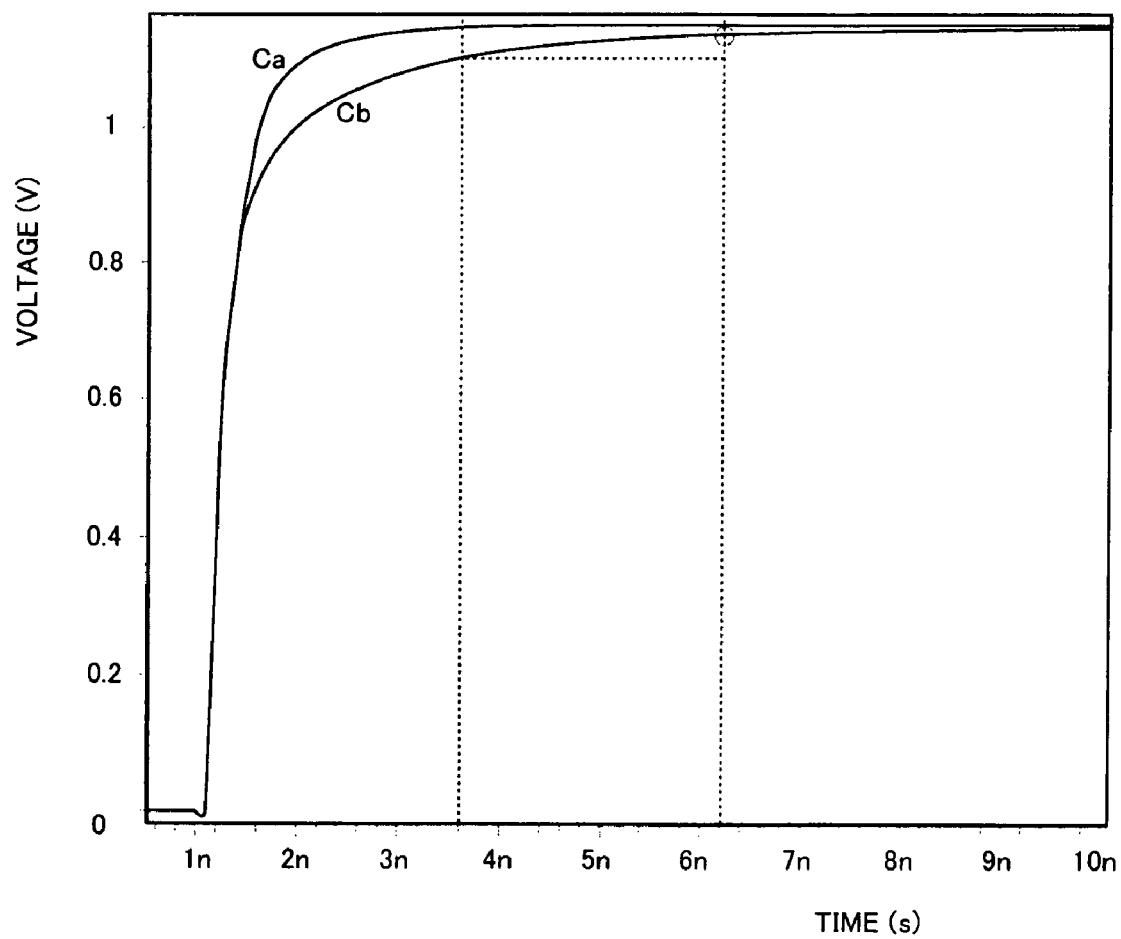
FIG. 5 is a diagram for explaining an effect when using the phase change memory device of the embodiment.
Figure 8:
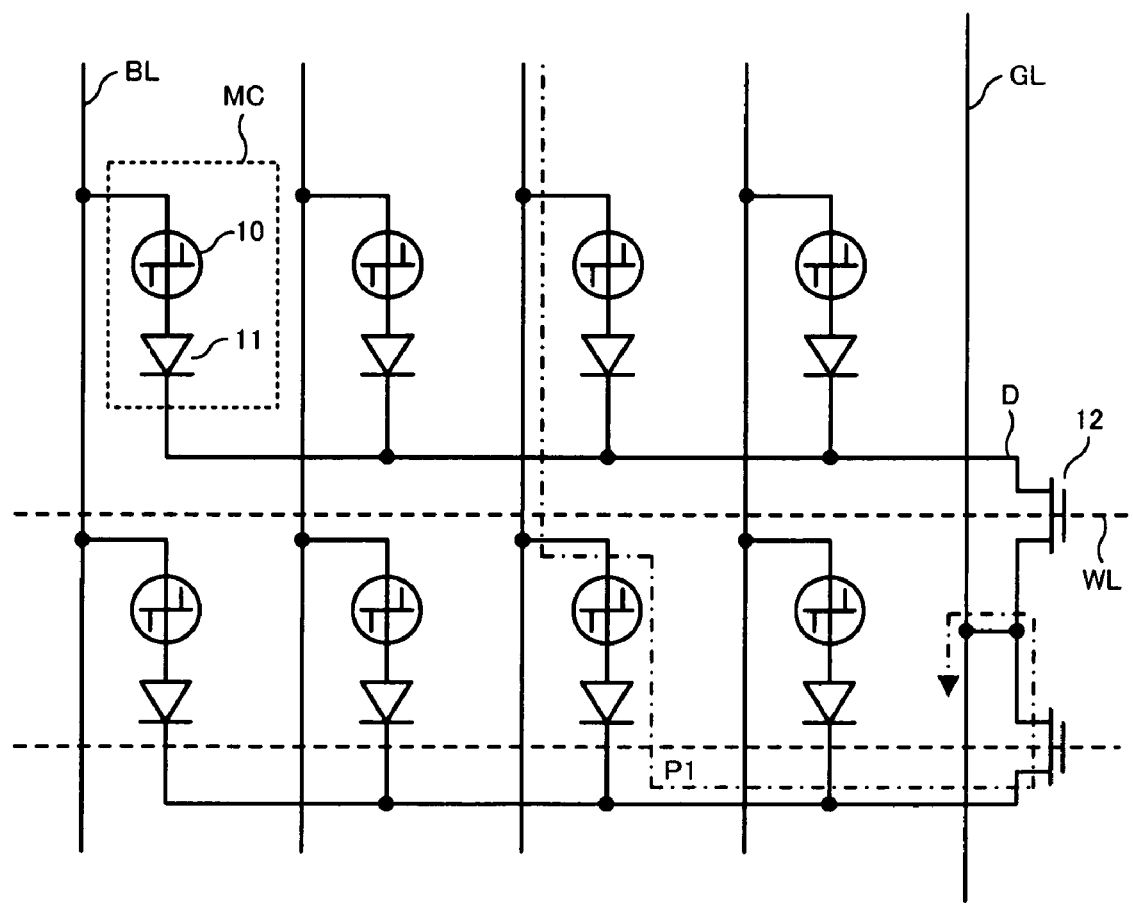
FIG. 8 is a diagram showing a second circuit configuration of the conventional phase change memory device having the memory cell using the diode.

Next an effect when using the phase change memory device of the embodiment will be described with reference to a graph of FIG. 5. In FIG. 5, times required for precharging the bit line BL are obtained by simulations and compared between the configuration of the embodiment in which the precharging PMOS transistors 22 are provided and the conventional configuration (FIG. 8) without the precharging PMOS transistors 22. In a case where the bit line BL is precharged to 1.15V, a characteristic Ca corresponding to the configuration of the embodiment and a characteristic Cb corresponding to the conventional configuration are shown respectively. As apparent by comparing the characteristics, the voltage changes more rapidly in the configuration of the embodiment than in the conventional configuration, and the effect of precharging the diffusion layers D by the operation of the precharging PMOS transistors 22 can be confirmed. In FIG. 5, when assuming that noise not exceeding 10 mV is permitted in precharging the bit line BL, the characteristic Ca requires a time of 2.6 ns while the characteristic Cb requires a time of 5.2 ns. Therefore, the operation speed can be approximately doubled by adopting the embodiment.

Figure 6:
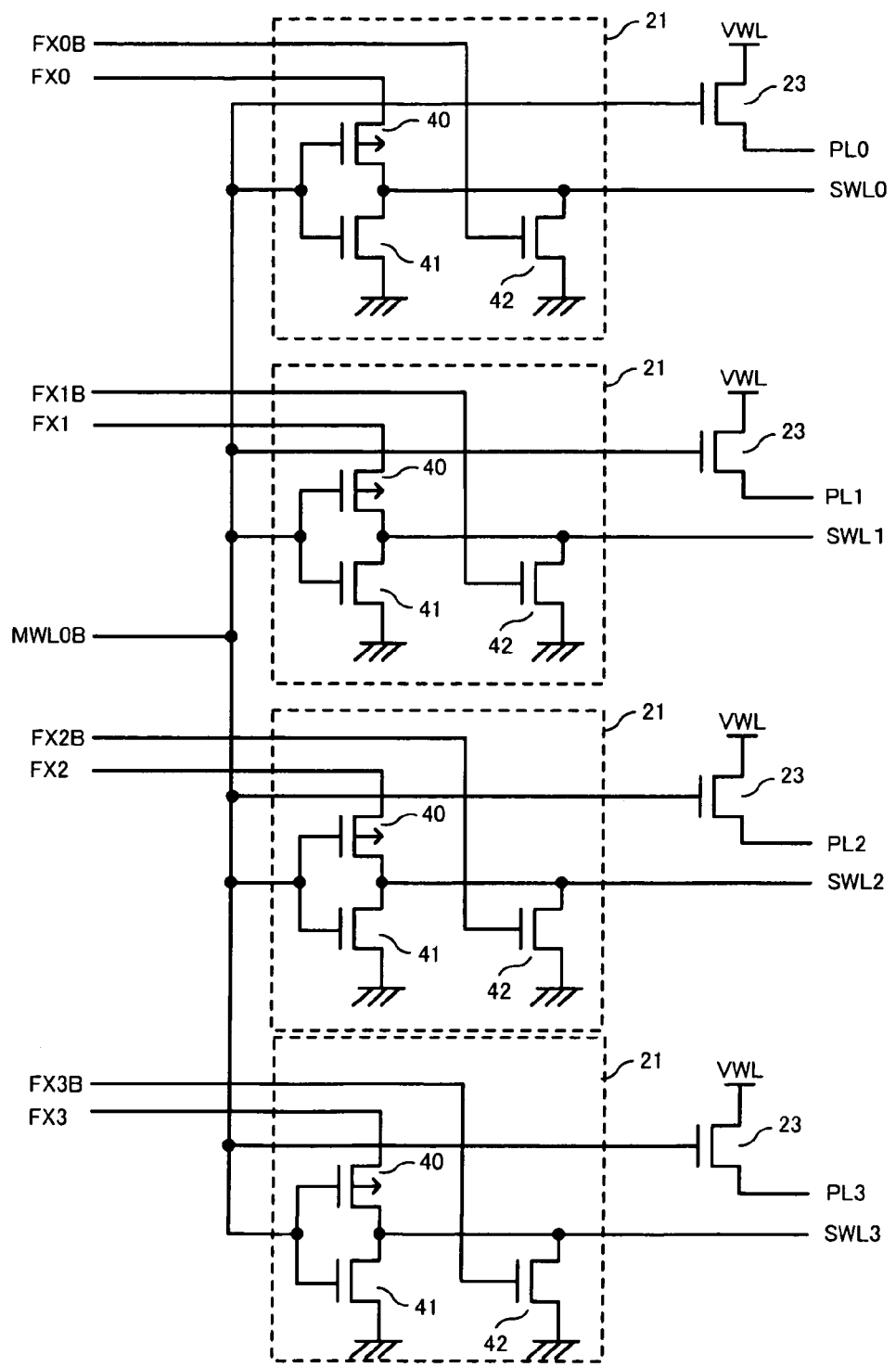
FIG. 6 is a diagram showing an example of a circuit configuration of the sub-word circuit 20 in a modification of the embodiment.
Figure 7:
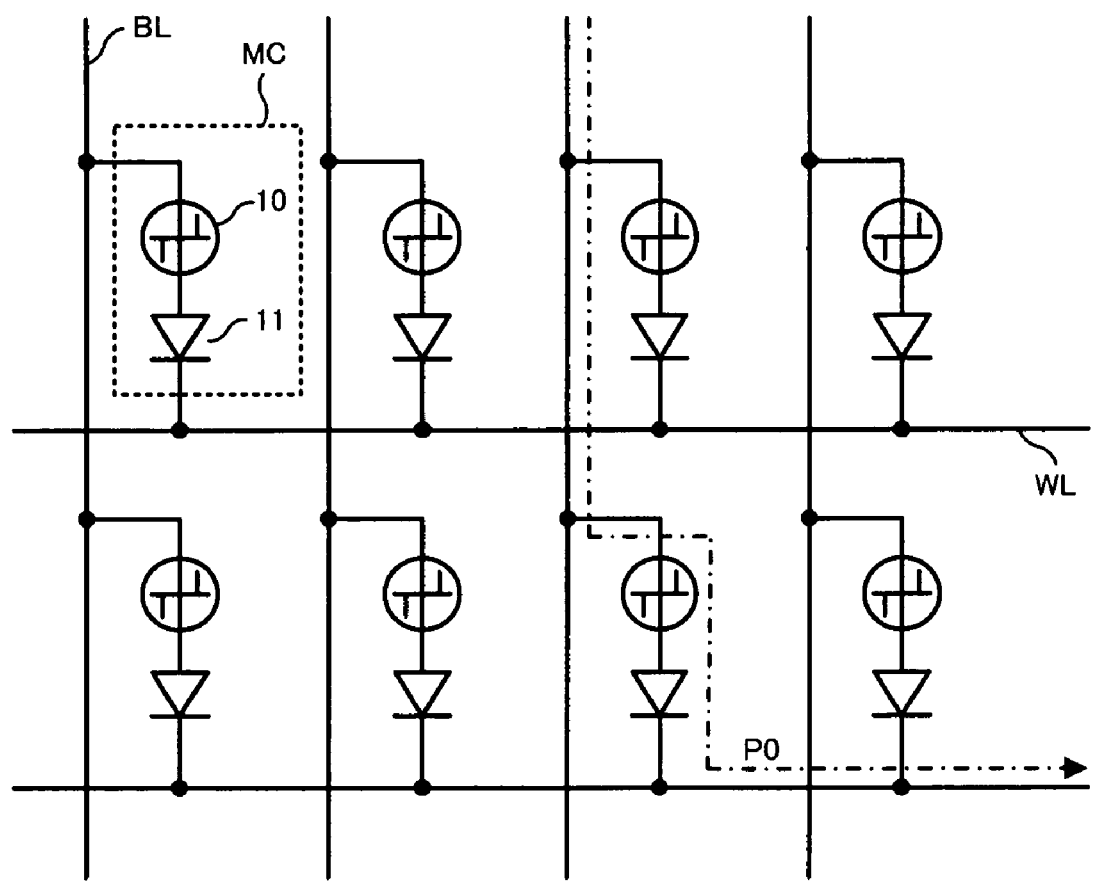
FIG. 7 is a diagram showing a first circuit configuration of a conventional phase change memory device having a memory cell using a diode.

Next, a modification of the embodiment will be described. FIG. 1 shows the precharging PMOS transistor 22 functioning as the precharge circuit of the present invention, however the precharge circuit may include an NMOS transistor. FIG. 6 shows an example of a circuit configuration of the sub-word circuit 20 in the modification of the embodiment corresponding to the circuit configuration of FIG. 4. The sub-word circuit 20 shown in FIG. 6 includes the four sub-word drivers 21, and four precharging NMOS transistor 23 connected to the four precharge lines PL0 to PL3. The sub-word drivers 21 are configured in the same manner as in FIG. 4, so description thereof is omitted.

Each precharging NMOS transistor 23 has a drain connected to the supply voltage VWL, a source connected to the precharge line PL, and a gate connected to the inverted main word line MWL0B. During stand-by operation, since the inverted main word line MWL0B is controlled to be a high level, all the four precharging NMOS transistors 23 become an ON state, and the respective precharge lines PL are connected to the supply voltage VWL. In this manner, the operation in FIG. 6 is the same as that in FIG. 4 during stand-by operation.

During normal operation, when the main word line MWL0 is selected, since a corresponding inverted main word line MWL0B goes low, all the four precharging NMOS transistors 23 become an OFF state and the respective precharge lines PL are disconnected from the supply voltage VWL. The operation in this case is different from that in FIG. 4, and the diffusion layers D are not precharged regardless whether the sub-word lines SWL0 to SWL3 are selected or not, during which the diffusion layers D are in a floating state. However, since a time period required for accessing a certain memory cell MC is limited to a predetermined time range (for example, 120 μs) during normal operation, the main word line MWL0 returns to a non-selected state after this time period elapsed. Thereby, the diffusion layers D are precharged through the precharge lines PL like in the abovementioned stand-by operation. In this manner, even when the circuit configuration of FIG. 6 is employed, it is avoided that the diffusion layers D remain in a floating state in a long period, thereby achieving the same effect as that of the circuit configuration of FIG. 4.

Although the present invention has been specifically described based on the embodiment, the present invention is not limited to the above-described embodiment, and various variations and modifications can be made without departing from the scope of the present invention. For example, the circuit configuration of the precharge circuit can be freely selected for the purpose of precharging the diffusion layers D. Further, the hierarchical word line structure is employed in order to arrange the main word lines MWL and the sub-word lines SWL in the embodiment, however the present invention can be applied to an arrangement without employing the hierarchical word line structure. Furthermore, as shown in FIG. 2, the layout in which the ground line GL is arranged in a mesh form is employed in the embodiment, however a layout in which the ground line GL extends only in, for example, a bit line direction can be employed.

The present invention is not limited to the above described embodiments, and various variations and modifications may be possible without departing from the scope of the present invention.

This application is based on the Japanese Patent application No. 2007-161936 filed on Jun. 19, 2007, entire content of which is expressly incorporated by reference herein.

What is claimed is:
1. A phase change memory device comprising:
   a phase change element for rewritably storing data by changing a resistance state;
   a memory cell arranged at an intersection of a word line and a bit line and formed of the phase change element and a diode connected in series;
   a select transistor formed in a diffusion layer below the memory cell, for selectively controlling electric connec- tion between an anode of the diode and a ground line in response to a potential of the word line connected to a gate; and a precharge circuit for precharging the diffusion layer below the memory cell corresponding to a non-selected word line to a predetermined voltage and for disconnecting the diffusion layer below the memory cell corresponding to a selected word line from the predetermined voltage.

2. The phase change memory device according to claim 1, wherein a write current flows along a path connecting the bit line, the phase change element, the diode, the select transistor and the ground line during write operation of the memory cell.

3. The phase change memory device according to claim 1, wherein the diffusion layer is formed in a rectangular area including N (N is an integer greater than or equal to two) memory cells in a bit line direction and two memory cells in a word line direction, and two said select transistors commonly connected to at least the N memory cells in the bit line direction are provided.

4. The phase change memory device according to claim 3, wherein the ground line is arranged in a mesh form in the bit line direction and the word line direction.

5. The phase change memory device according to claim 1, wherein the word line has a hierarchical word line structure with a main word line and sub-word lines, a sub-word driver for selectively activating one of a predetermined number of the sub-word lines when the main word line is selected is provided, and each of the sub-word lines is connected to a gate of the select transistor.

6. The phase change memory device according to claim 5, wherein the precharge circuit is provided for each of the sub-word drivers, the precharge circuit corresponding to a non-selected sub-word line precharges the diffusion layer to the predetermined voltage, and the precharge circuit corresponding to a selected sub-word line disconnects the diffusion layer from the predetermined voltage.

7. The phase change memory device according to claim 6, wherein the precharge circuit includes a PMOS transistor having a gate to which the sub-word line is connected and for controlling connection of the diffusion layer with the predetermined voltage, and the sub-word line is controlled to be a high level when selected and to be a low level when non-selected.

8. The phase change memory device according to claim 6, wherein the precharge circuit includes an NMOS transistor having a gate to which an inverted main word line obtained by inverting the main word line is connected and for controlling connection of the diffusion layer with the predetermined voltage, and the main word line is controlled to be a high level when selected and to be a low level when non-selected.

9. A phase change memory device comprising:
a plurality of first signal lines;
a plurality of second signal lines each intersecting the first signal lines;
a reference potential line;
a precharge potential line;
a plurality of memory cells each disposed at a different one of intersections of the first and second signal lines, each of the memory cells including a phase change element and a unidirectional element connected in series to each other;
a plurality of selection transistors each connected between an associated one of the second signal lines and the reference potential line; and
a plurality of precharge transistors accompanied respectively with the selection transistors, each of the precharge transistors being connected between an associated one of the second signal lines and the precharge potential line and rendered conductive when an associated one of the selection transistors is turned OFF and non-conductive when the associated one of the selection transistors is turned ON.

10. The device as claimed in claim 9, wherein the second signal line is made of a diffusion layer.

11. The device as claimed in claim 9, further comprising a plurality of third signal lines each connected to a control electrode of an associated one of the selection transistors.

12. The device as claimed in claim 11, wherein each of the precharge transistors has a control electrode connected to an associated one of the third signal lines, and the each of the selection transistors is different in conductivity type from each of the precharge transistors.

13. The device as claimed in claim 11, wherein each of the precharge transistors has a control electrode connected through an inverter to an associated one of the third signal lines, and the each of the selection transistors is identical in conductivity type to each of the precharge transistors.

14. The device as claimed in claim 11, wherein the second signal line is made of a diffusion layer.

* * * * *